(12) United States Patent
Tsuji

(10) Patent No.: US 7,265,816 B2
(45) Date of Patent: Sep. 4, 2007

(54) ILLUMINATION OPTICAL SYSTEM, EXPOSURE APPARATUS, AND DEVICE MANUFACTURING METHOD WITH MODIFIED ILLUMINATION GENERATOR

(75) Inventor: Toshihiko Tsuji, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 11/158,017

(22) Filed: Jun. 20, 2005

(65) Prior Publication Data

US 2005/0280794 A1 Dec. 22, 2005

(30) Foreign Application Priority Data

Jun. 21, 2004 (JP) .............................. 2004-183019

(51) Int. Cl.
G03B 27/72 (2006.01)
G03B 27/54 (2006.01)

(52) U.S. Cl. .......................................... 355/71; 355/67

(58) Field of Classification Search ............. 355/67–71
See application file for complete search history.

(56) References Cited

U.S. PATENT DOCUMENTS

| 5,465,220 | A | 11/1995 | Haruki et al. |
| 6,597,430 | B1 * | 7/2003 | Nishi et al. .................... 355/53 |
| 6,816,234 | B2 | 11/2004 | Tsuji |
| 7,098,992 | B2 * | 8/2006 | Ohtsuki et al. ............... 355/69 |
| 2001/0055107 | A1 | 12/2001 | Tsuji |

FOREIGN PATENT DOCUMENTS

| JP | 6-53120 A | 2/1994 |
| JP | 6-275493 | 9/1994 |
| JP | 7-183201 A | 7/1995 |
| JP | 11-176721 A | 7/1999 |
| JP | 2001-284212 A | 10/2001 |
| JP | 2001-284237 A | 10/2001 |
| JP | 3246615 | 11/2001 |
| JP | 2005-93522 A | 4/2005 |
| KR | 1020060048452 | 5/2006 |
| WO | 2005/027207 A1 | 3/2005 |

OTHER PUBLICATIONS

Office Action (Notice of Remarks Filing) issued to the Korean counterpart and mailed Aug. 9, 2006.

* cited by examiner

*Primary Examiner*—Diane Lee
*Assistant Examiner*—Chia-how Michael Liu
(74) *Attorney, Agent, or Firm*—Morgan & Finnegan, LLP

(57) ABSTRACT

An illumination optical system for illuminating a target surface using light from a light source includes a modified illumination generator for generating a modified illumination with a predetermined polarization state for the target surface, wherein the modified illumination generator includes a λ/4 phase plate unit that includes a λ/4 phase plate for converting a circularly polarized light into a linearly polarized light in a predetermined direction, and a diffractive optical element unit that is arranged in a substantially conjugate relationship with the target surface, and includes a diffractive optical element used for the λ/4 phase plate to generate a predetermined illumination intensity distribution when the diffractive optical element unit receives the linearly polarized light.

8 Claims, 13 Drawing Sheets

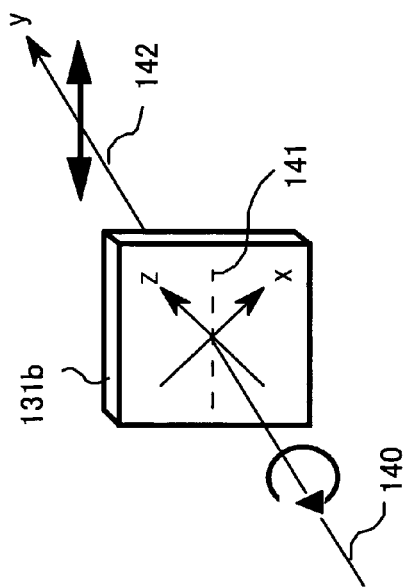
FIG. 3
FIG. 4C
FIG. 4B
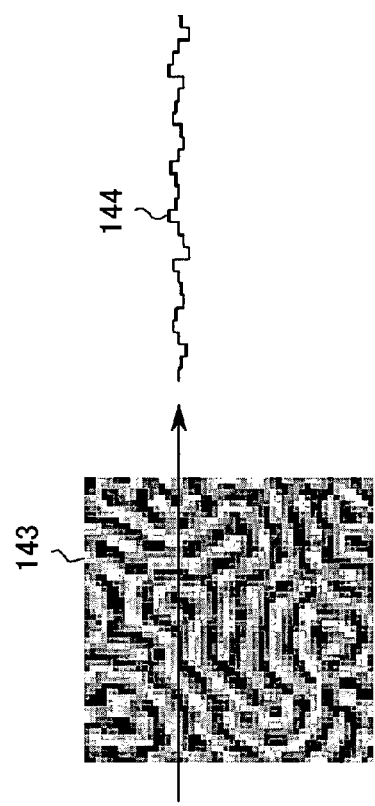
FIG. 4A

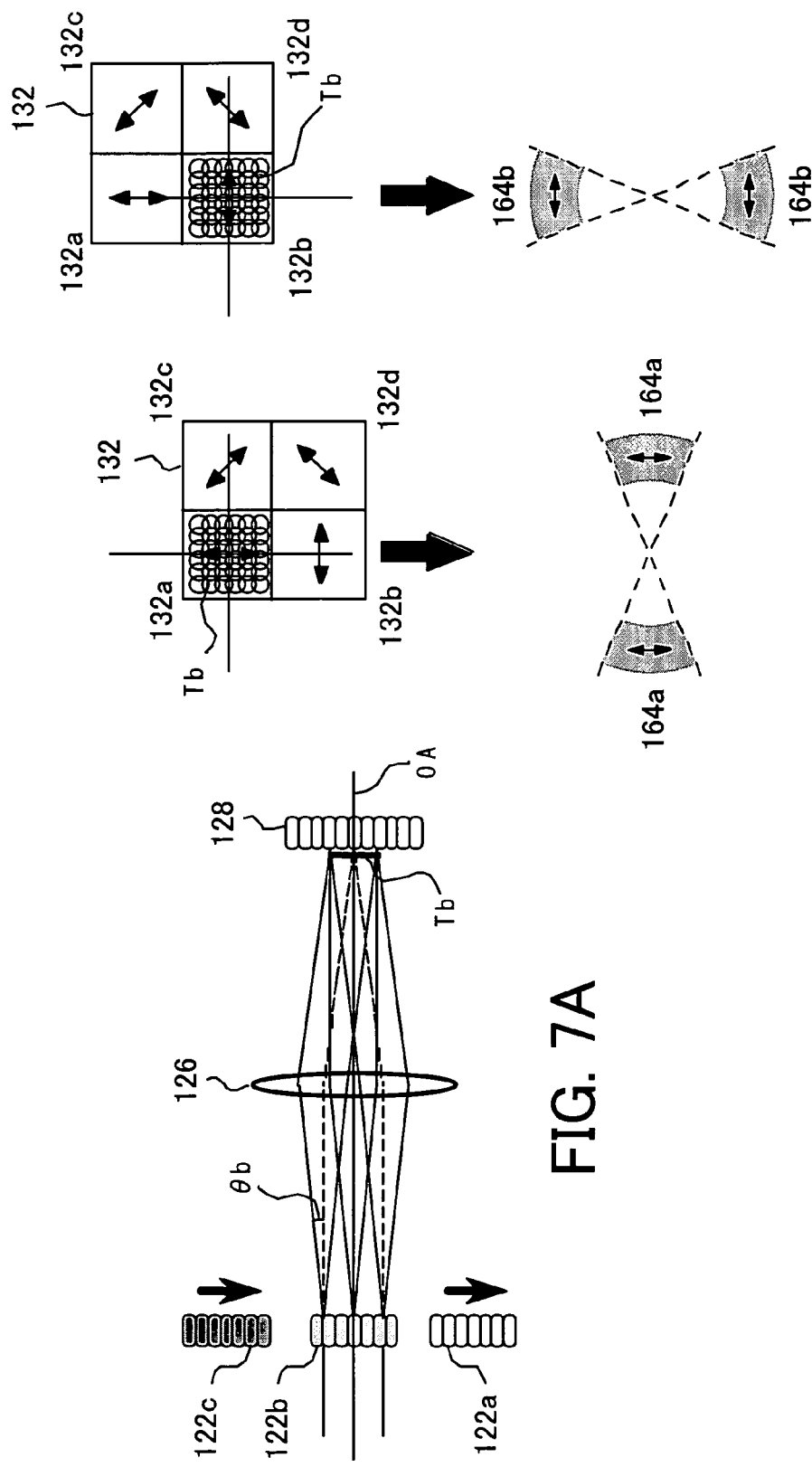

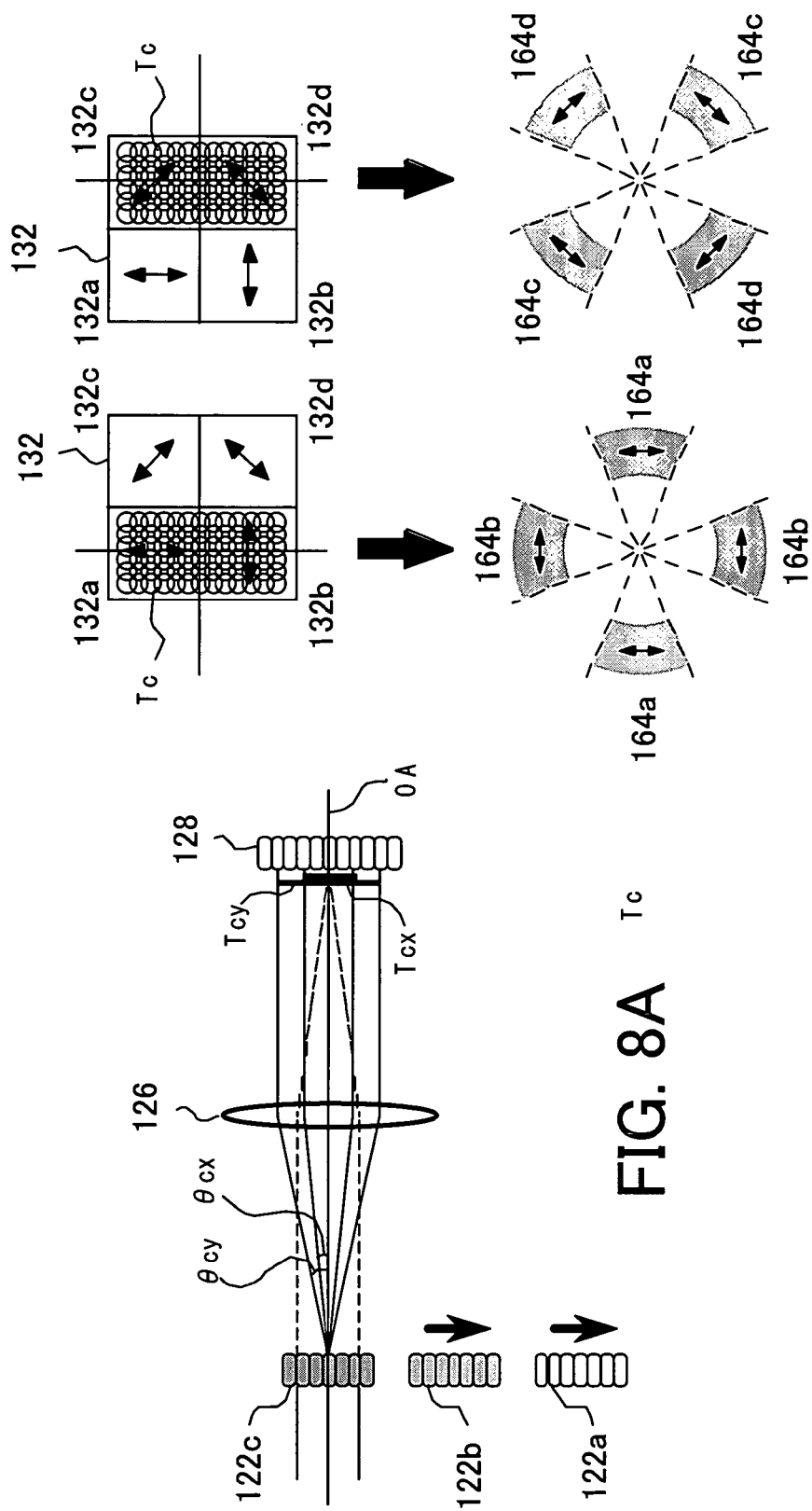

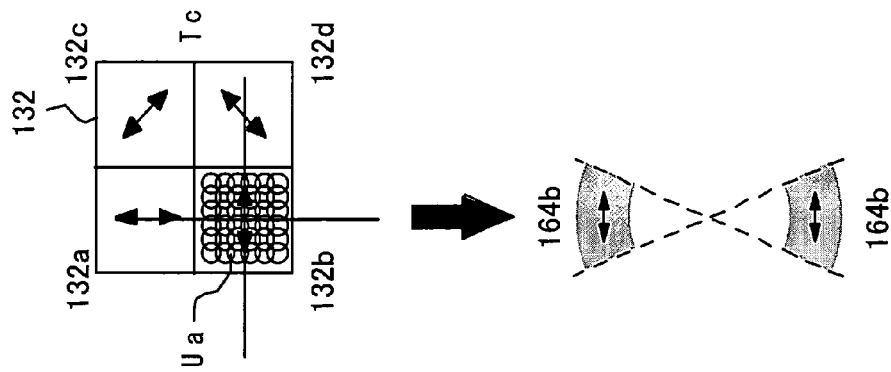
FIG. 12
FIG. 11
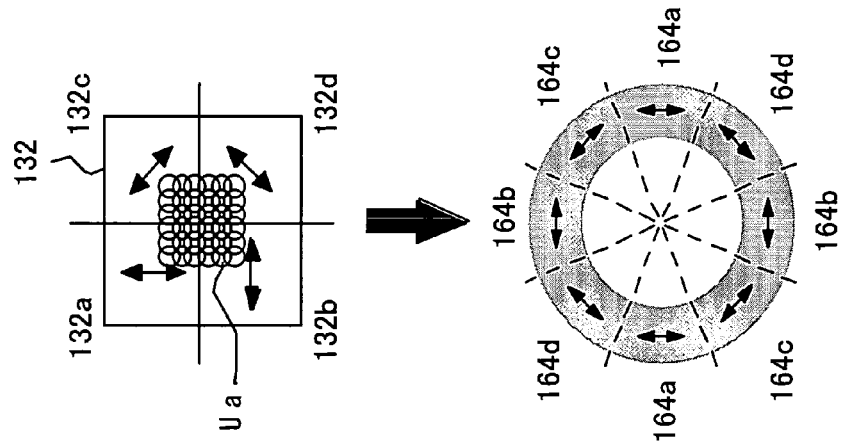
FIG. 10

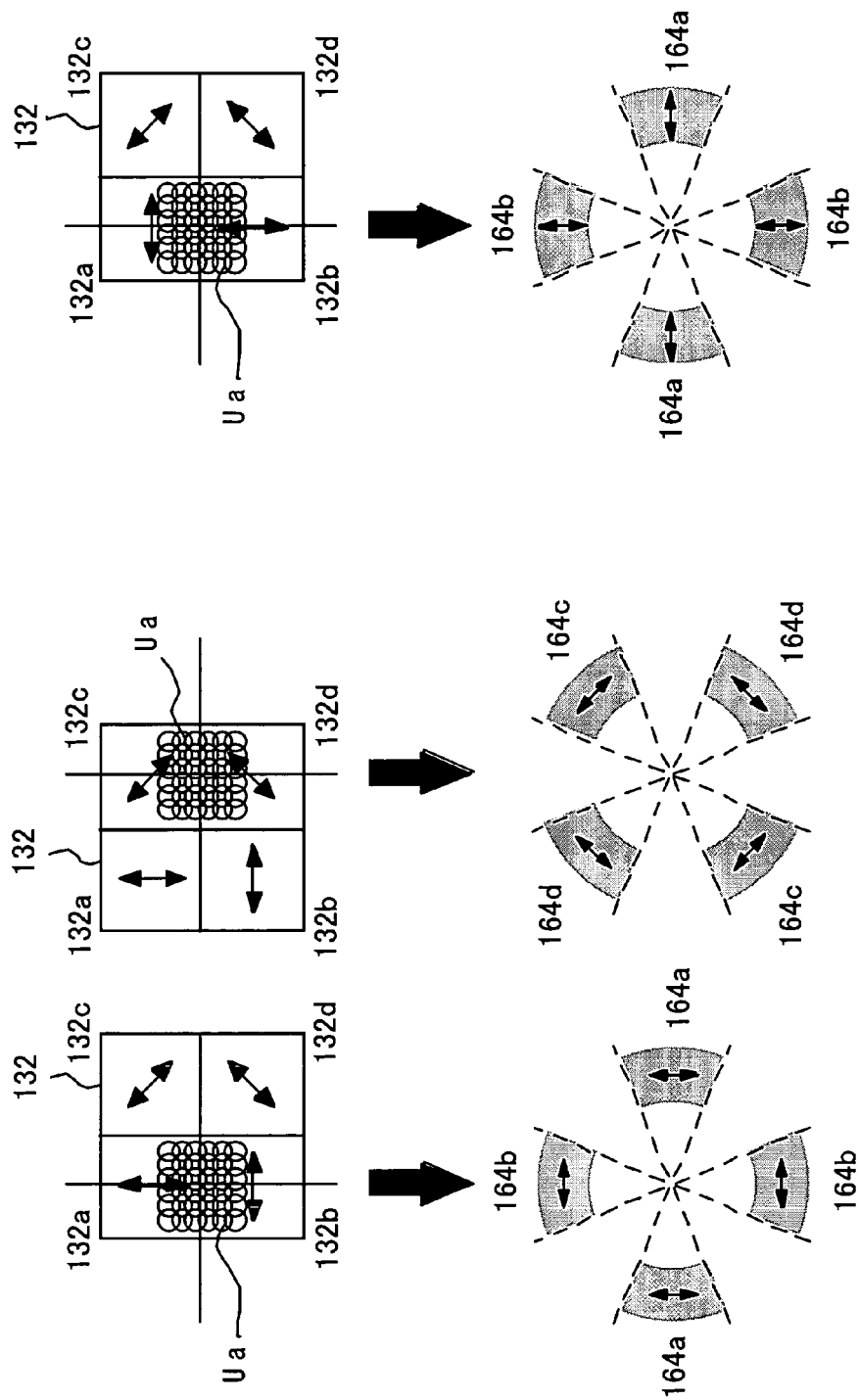

ILLUMINATION OPTICAL SYSTEM, EXPOSURE APPARATUS, AND DEVICE MANUFACTURING METHOD WITH MODIFIED ILLUMINATION GENERATOR

BACKGROUND OF THE INVENTION

The present invention relates generally to an illumination optical system, and more particularly to an illumination optical system, exposure apparatus and device manufacturing method for exposing an object, such as a single crystal substrate for a semiconductor wafer, and a glass plate for a liquid crystal panel.

The recent demands for smaller and thinner profile electronic devices have increasingly demanded finer devices, such as a semiconductor device, to be mounted onto these electronic devices. A projection exposure apparatus is a vital apparatus to the photolithography process that is generally used to manufacture these devices, and exposes a pattern of a reticle (or mask) onto a resist-applied substrate, such as a silicon wafer and a glass plate.

The resolution R of the projection exposure apparatus is given by the following equation, where λ is a light-source wavelength λ, NA is a numerical aperture of the projection optical system, and $k_1$ is a process constant of a development process:

$$R = k_1 \times \frac{\lambda}{NA} \qquad \text{[EQUATION 1]}$$

Equation 1 indicates that a smaller wavelength and a larger NA improve the resolution. However, the smaller wavelength would disadvantageously reduce the transmittance of a glass material, the depth of focus ("DOF") decreases in inverse proportion to the NA, and a larger NA makes difficult a design and manufacture of a lens.

Accordingly, the resolution enhanced technology ("RET") has recently been proposed which reduces the process constant $k_1$ for the fine processing. One RET is a modified illumination, which is also referred to as an oblique incidence illumination or an off-axis illumination. The modified illumination arranges an aperture stop with a light shielding plate on an optical axis in an optical system near an exit surface of an optical integrator for forming a uniform surface light source, and introduces exposure light oblique to the reticle. The modified illumination includes an annular illumination and a quadrupole illumination in accordance with a shape of the aperture stop.

It has been conventionally proposed to configure the modified illumination with only the linearly polarized light in a desired direction so as to improve the image contrast. See, for example, Japanese Patent Applications, Publication Nos. 7-183201 and 6-053120. Japanese Patent Application, Publication No. 7-183201 filters out the light different from the desired polarization direction. Japanese Patent Application, Publication No. 6-053120 discloses a method of using a linearly polarizer to generate a linearly polarized light in advance of and of arranging a λ/2 phase plate to generate a linearly polarized light in a desired direction.

Other prior art include Japanese Patent Applications, Publication Nos. 2001-284212, 2001-284237, 6-275493, and 11-176721, and Japanese Patent No. 3,246,615.

However, Japanese Patent Application, Publication No. 7-183201 removes the light other than the light of a desired polarization direction, deteriorates the illumination efficiency and lowers the throughput. Japanese Patent Application, Publication No. 6-053120 causes the light that passes the λ/2 phase plate to be the elliptically polarized light instead of the linearly polarized light when there is a phase offset caused by an optical element in the illumination optical system, problematically lowering the image contrast.

BRIEF SUMMARY OF THE INVENTION

The present invention is directed to an illumination optical system, an exposure apparatus having the same, and a device manufacturing method using the exposure apparatus, in which an arbitrary modified illumination is made of a linearly polarized light in a desired direction without drastically lowering the illumination efficiency.

An illumination optical system according to one aspect of the present invention for illuminating a target surface using light from a light source includes a modified illumination generator for generating a modified illumination with a predetermined polarization state for the target surface, wherein the modified illumination generator includes a λ/4 phase plate unit that includes a λ/4 phase plate for converting a circularly polarized light into a linearly polarized light in a predetermined direction, and a diffractive optical element unit that is arranged in a substantially conjugate relationship with the target surface, and includes a diffractive optical element used for the λ/4 phase plate to generate a predetermined illumination intensity distribution when the diffractive optical element unit receives the linearly polarized light.

An illumination optical system according to another aspect of the present invention for illuminating a target surface using light from a light source includes a diffractive optical element unit for diffracting the light and for generating a predetermined illumination intensity distribution on a predetermined surface substantially having a Fourier transformation relationship with the target surface, an optical unit for illuminating the diffractive optical element unit, and an illumination area changing unit for changing an illuminated area on the diffractive optical element unit by the optical unit.

An illumination optical system according to still another aspect of the present invention for illuminating a target surface using light from a light source includes a diffractive optical element unit for diffracting the light and for generating a predetermined illumination intensity distribution on a predetermined surface that substantially has a Fourier transformation relationship with the target surface, the diffractive optical element unit including plural diffractive optical elements each for forming areas that have different illumination intensity distributions, an optical unit for illuminating the diffractive optical element unit by using the light from the light source, and a polarization unit arranged near the diffraction optical element unit, the polarization unit including plural polarizers each used for a corresponding one of the plural diffractive optical elements, the plural polarizers each converting incident light into linearly polarized lights in different directions.

An exposure apparatus according to another aspect of the present invention includes the above illumination optical system for illuminating a reticle that has a pattern, and a projection optical system for projecting onto an object, the pattern of the reticle illuminated by the illumination optical system.

A device manufacturing method according to another aspect of the present invention includes the steps of exposing an object using the above exposure apparatus, and developing the object. Claims for a device manufacturing method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to the accompanying drawings.

BRIEF DESCRIPTION OF THE DRAWINGS

FIG. 3 is a schematic perspective view for explaining an operation of λ/4 phase plate in the modified illumination generating means shown in FIG. 2.

FIGS. 4A to 4C are a front view and an illumination intensity distribution generated by a diffractive optical element ("DOE") in the modified illumination generating means shown in FIG. 1.

FIGS. 7A, 7B and 7C are schematic sectional and plane views for explaining a change of a size of an illumination area in the modified illumination generating means by changing a divergent angle of the exit angle preserving optical element shown in FIG. 1.

FIGS. 8A, 8B and 8C are schematic sectional and plane views for explaining a change of a size of an illumination area in the modified illumination generating means by changing a divergent angle of the exit angle preserving optical element shown in FIG. 1.

FIG. 10 is a schematic plane view for explaining that an annular illumination by a modified illumination generating means shown in FIG. 9 forms an annular illumination.

FIG. 11 is a schematic plane view for explaining that a modified illumination generating means shown in FIG. 9 forms a dipole illumination.

FIG. 12 is a schematic plane view for explaining that a modified illumination generating means shown in FIG. 9 forms a dipole illumination.

FIG. 13 is a schematic plane view for explaining that a modified illumination generating means shown in FIG. 9 forms a quadrupole illumination.

FIG. 14 is a schematic plane view for explaining that a modified illumination generating means shown in FIG. 9 forms a quadrupole illumination.

FIG. 15 is a schematic plane view for explaining that a modified illumination generating means shown in FIG. 9 forms a quadrupole illumination.

DETAILED DESCRIPTION OF THE PREFERRED EMBODIMENTS

Figure 1:
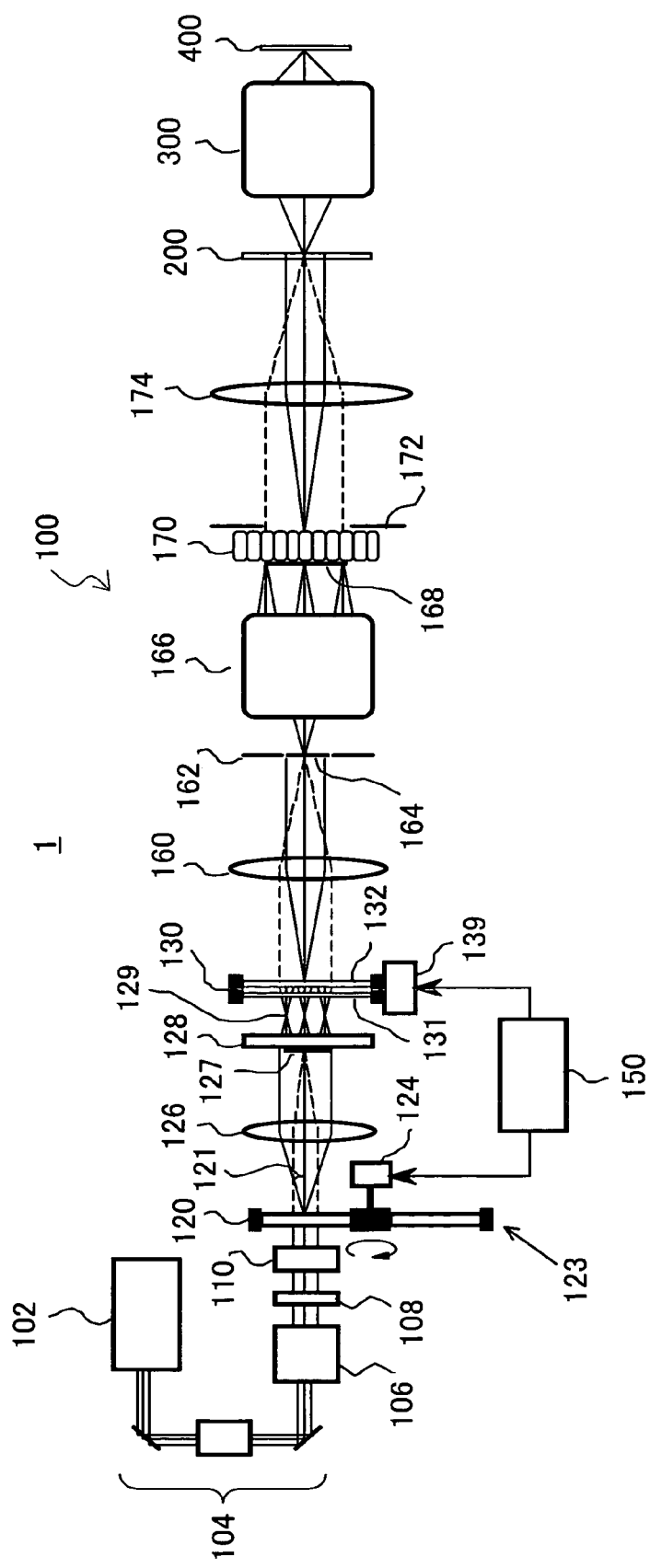
FIG. 1 is a schematic block diagram of an exposure apparatus according to a first embodiment of the present invention.

With reference to the accompanying drawings, a description will now be given of an exposure apparatus 1 having an illumination apparatus 100 according to a first embodiment of the present invention. FIG. 1 is a schematic block diagram of the exposure apparatus 1. The exposure apparatus 1 is a step-and-scan projection exposure apparatus ("scanner") that exposes a circuit pattern of a reticle 200 onto an object (or a plate) 400 in a manner. Of course, the present invention is applicable to a step-and-repeat exposure apparatus ("stepper"). The exposure apparatus 1 is suitable for a sub-micron or quarter-micron lithography process. The "step-and-scan manner", as used herein, is an exposure method that exposes a reticle pattern onto a wafer by continuously scanning the wafer relative to the reticle, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

The exposure apparatus 1 includes an illumination apparatus 100, a reticle 200, a projection optical system 300, and a plate 400.

The illumination apparatus 100 illuminates the reticle 200 that has a circuit pattern to be transferred, and includes a light source 102, an illumination optical system (104 to 174), and a driver 150 having a CPU.

The light source 102 employs, for example, an ArF excimer laser with a wavelength of approximately 193 nm, KrF excimer laser with a wavelength of approximately 248 nm, etc. A type of laser is not limited to excimer laser, and the number of laser units is not limited. A light source applicable to the light source section 102 is not limited to the laser, but may use one or more lamps such as a mercury lamp and xenon lamp.

The illumination optical system is an optical system that provides a modified illumination with a predetermined polarization state to the reticle 200 while maintaining a predetermined light intensity.

The illumination optical system is an optical system that maintains the light intensity and illuminates the reticle 200 with a modified illumination with a predetermined polarization state. The illumination optical system includes a deflection optical system 104, a beam shaping optical system 106, a polarization control means 108, a phase control means 110, an exit angle preserving optical element 120, a relay optical system 126, a multi-beam generating means 128, a modified illumination generating means 130, a relay optical system 160, an aperture 162, a zooming optical system 166, a multi-beam generating means 170, an aperture stop 172, and an irradiating means 174.

The deflection optical system 104 introduces the light from the light source 102 to the beam shaping optical system 106. The beam shaping optical system 106 can use, for example, a beam expander having a plurality of cylindrical lenses, etc. and convert an aspect ratio of the size of the sectional shape of a collimated beam from the laser light source into a desired value (for example, by changing the sectional shape from a rectangle to a square), thus reshaping the beam shape to a desired one. The beam shaping system 106 forms a beam that has a size and divergent angle necessary to illuminate the multi-beam generating means 128.

The polarization control means 108 includes a linear polarizer etc., and serves to remove unnecessary polarized light. When the light source 102 uses the ArF excimer laser, the exited light is almost linearly polarized light. Even when the polarization plane is disturbed in the deflection optical system 104, the light enters the polarization control means 108 while the linearly polarized light dominates the light. The polarization control means 108 serves to remove any unnecessary polarized light in the incident light so that the transmittable linear polarization direction accords with the dominative polarization direction in the incident light. The desired, linearly polarized light can be efficiently taken out by minimizing the polarized light to be shielded at the polarization control means 108.

The phase control means 110 provides a phase difference of $\lambda/4$ to the linearly polarized light that has been converted by the polarization control means 108, and converts the linearly polarized light into the circularly polarized light. The phase control means 110 serves as a phase plate that converts the linearly polarized light into perfectly or approximately circularly polarized light, and includes a $\lambda/4$ phase plate. In FIG. 1, when the light passes the polarization control means 108, only a polarization component parallel to the paper surface at the right side of the polarization control means 108 enters the phase control means 110, and becomes the circularly polarized light at the right of the phase control means 110. However, this is merely one embodiment, and it is not vital that the polarization direction is parallel to the paper surface at the left side of the phase control means 110. When an effective light source distribution of a desired polarization state is unavailable due to the influence of the phase offset caused by the optical system, the phase control means 110 adjusts a phase so as to cancel the phase offsetting amount.

The exit angle preserving optical element 120 emits the light at a constant divergent angle, and includes an optical integrator, such as a fly-eye lens that includes plural micro-lenses, and a fiber bundle. With reference to FIGS. 6 to 8, the exit angle preserving optical element 120 of this embodiment has plural elements 122a to 122c having different exit angles. In this embodiment, each of these plural elements 122a to 122c is a fly-eye lens that includes micro-lenses and each micro-lens has a rectangular shape. The elements 122a to 122c are arranged on a turret 123. The turret 123 is driven by a driving mechanism 124, and switches the elements 122a to 122c to be located on the optical path. The driving mechanism 124 is controlled by a signal from the driver 150. As the turret 123 switches the elements 122a to 122c, the size and shape of the illumination area are controlled on the modified illumination generating means 130, which will be described later.

The relay optical system 126 condenses the light exited from the exit angle preserving optical element 120 into the multi-beam generating means 130. The relay optical system 126 maintains a Fourier transformation relationship between an exit surface of the exit angle preserving optical element 120 and an incident surface of the multi-beam generating means 128 (or a relationship between an object surface and a pupil surface or a pupil surface and an image surface). An exit angle 121 is fixed by an exit NA of the micro-lens and the distribution 127 of the light incident upon the incident surface of the multi-beam generating means 128 is always fixed in place on the surface even when the optical axis of the incident light fluctuates, forming a uniform illumination intensity distribution by multiple beams superimposed under the Koehler illumination condition. The shape of the uniform illumination area 127 is similar to the outer shape of the micro lens in the exit angle preserving optical element 120. In this embodiment, the exit angle preserving optical element 120 is a rectangular micro-lens array and the illumination area 127 has an approximately square shape.

The multi-beam generating means 128 is an optical integrator for uniformly illuminating the modified illumination generating means 130, such as a fly-eye lens that has plural micro-lenses, and a fiber bundle, and the exit surface forms a light source plane with plural point light sources. Each fine lens may be made of a diffractive optical element ("DOE"), or a micro-lens array formed by etching process on the substrate. The multi-beam generating means in this embodiment is an optical element that has plural optical axes, forms a finite area around each optical axis, and identifies one beam in each area. The circularly polarized light emitted from the multi-beam generating means 128 has a constant exit angle because of the fixed exit NA of the lens element. The light emitted at a desired exit angle from each lens element is introduced as the circularly polarized light into the modified illumination generating means 130.

Figure 2:
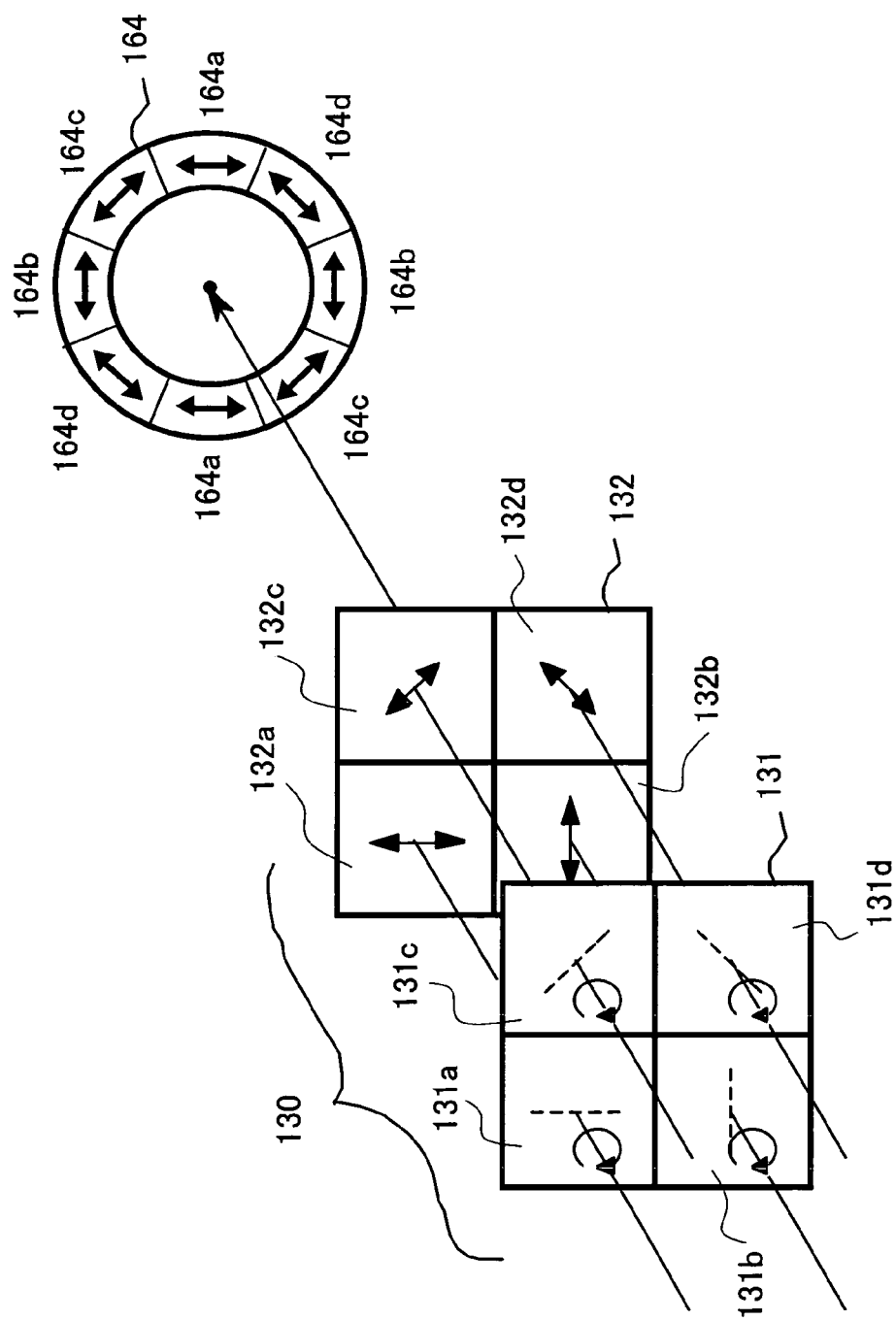
FIG. 2 is a schematic perspective view of a modified illumination generating means in an exposure apparatus shown in FIG. 1 and an illumination intensity distribution generated by the modified illumination generating means.

The modified illumination generating means 130 provides a modified illumination with the predetermined linearly polarized light, and improves the resolution R by reducing a value of a process constant $k_1$ in Equation 1. The modified illumination generating means 130 includes a $\lambda/4$ phase plate unit (polarization unit) 131 and a DOE unit 132. FIG. 2 schematically shows an illumination intensity distribution generated when the circularly polarized light is incident upon the modified illumination generating means 130. While FIG. 2 maintains a large interval between the $\lambda/4$ phase plate unit 131 and the DOE unit 132, the actual apparatus arranges them closely adjacent to each other.

As shown in FIG. 2, the $\lambda/4$ phase plate unit 131 of this embodiment arranges four square-shaped $\lambda/4$ phase plates (or polarization members) in parallel. In other words, the $\lambda/4$ phase plate unit 131 has four areas or $\lambda/4$ phase plates 131a to 131d having different optical axis directions.

FIG. 3 schematically shows an operation of one area 131b in the $\lambda/4$ phase plate unit 131. The $\lambda/4$ phase plate 131b is made, for example, of a birefringent crystal, such as quartz. The thickness of the $\lambda/4$ phase plate 131b is adjusted so that when the circularly polarized light 140 is incident in the y direction when the optical axis is aligned with the z direction, a phase difference of $\lambda/4$ wavelength ($\pi/2$) occurs between a component that oscillates in the z direction (extraordinary ray) and a component that oscillates in the x direction (ordinary ray) This configuration provides the linearly polarized light 142 on the xz plane, which oscillates in a direction 141 having an azimuth of 45° relative to the x-axis.

The areas 131a to 131d are set so that the exit lights have different polarization directions when receiving the circularly polarized light. When the coordinate similar to FIG. 3 is set, the area 131a provides the linearly polarized light that oscillates in a direction having an azimuth of −45° relative to the x-axis on the xz plane, the area 131b provides the linearly polarized light that oscillates in the x-axis direction on the xz plane, and the area 131c provides the linearly polarized light that oscillates in the z-axis direction on the xz plane. FIG. 2 shows these linearly polarized lights in broken lines. As a result, the areas 131a to 131d emit the linearly polarized lights in the perpendicular direction and directions of ±45° relative to the horizontal direction.

The DOE unit 132 includes plural DOEs as computer generated holograms ("CGHs") each of which is designed to generate a desired illumination intensity distribution as the reproduced image 164 at a position of the aperture 162 via the relay optical system 160 when receiving the incident light. Of course, the DOE unit 132 can use an amplitude hologram, a phase hologram, and a kinoform.

In this embodiment, the DOE unit 132 arranges four CGHs in a square shape like the areas 132a to 132d. The CGH 132a and λ/4 phase plate 131a, the CGH 132b and λ/4 phase plate 131b, the CGH 132c and λ/4 phase plate 131c, and the CGH 132d and λ/4 phase plate 131d make pairs. In changing positions of the CGHs 132a to 132d, the positions of the λ/4 phase plates 131a to 131d should be changed. The λ/4 phase plate unit 131 is adapted so that an arrangement is variable among the λ/4 phase plates 131a to 131d. Similarly, the DOE unit 132 is adapted so that an arrangement is variable among the CGHs 132a to 132d.

The DOE unit 132 is a phase type computer generated hologram ("CGH") that serves as a DOE in this embodiment, and has a stepwise relief shape on the substrate surface. The CGH is a hologram produced by calculating an interference fringe pattern between the object light and the reference light, and directly outputted from an imaging machine. The interference fringe shape that provides a desired illumination intensity distribution of the reproduced light can be easily calculated through repetitive calculations using a computer.

FIG. 4A is a front view of the thus-produced phase type CGH, and FIG. 4B is a schematic sectional view taken along an arrow in FIG. 4A. FIG. 4A denotes a convexoconcave phase distribution formed on a substrate as a gray scale distribution 143. The semiconductor device manufacturing technology is applicable to a production of the stepwise section like a section 144, and implements fine pitches relatively easily. The illumination intensity distribution obtained as a reproduced image of this phase type CGH is a dipole distribution shown in FIG. 4C, and it is a horizontal dipole distribution in this example.

The phase type CGHs 132a to 132d in FIG. 2 are designed so that their reproduced images form a dipole illumination intensity distribution and their distribution directions are different from each other. More specifically, the reproduced image of the CGH 132a is a horizontal dipole distribution, the reproduced image of the CGH 132b is a perpendicular dipole distribution, and the reproduced images of the CGHs 132c and 132d are dipole distributions in ±45° directions. When the light is incident upon all of the CGHs 132a to 132d, the reproduced images 164 of the dipole distributions are synthesized on the image plane, and form an annular distribution that includes four pairs of dipole distributions 164a to 164d in the peripheral. The four pairs of dipole distributions 164a to 164d correspond to distributions formed by the CGHs 132a to 132d. The light incidents upon the areas 132a to 132d have polarization directions in arrows shown in FIG. 2 due to the λ/4 phase plate unit 131. As the polarization direction of the reproduced image 164 accords with the polarization direction of the incident light, the reproduced image 164 of this embodiment becomes a linearly polarized light having a tangential polarization direction (or a tangential direction of the annulus).

The illumination intensity distribution as the reproduced image 164 of the modified illumination generating means 130 is not limited to the annular distribution, but may include an arbitrary distribution suitable for the illuminated pattern, such as a quadrupole distribution and a dipole distribution. The polarization direction is not limited to the tangential direction of the circle around the optical axis but may be an arbitrary direction, such as a radial direction.

Figure 5B:
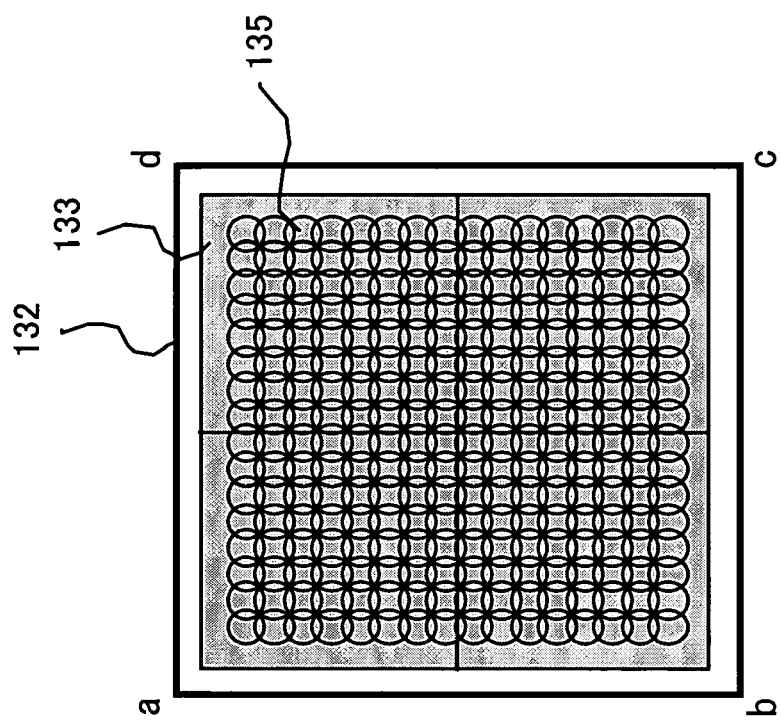
FIGS. 5A and 5B are schematic plane views of multiple light spots incident upon the DOE unit shown in FIG. 2.
Figure 5A:
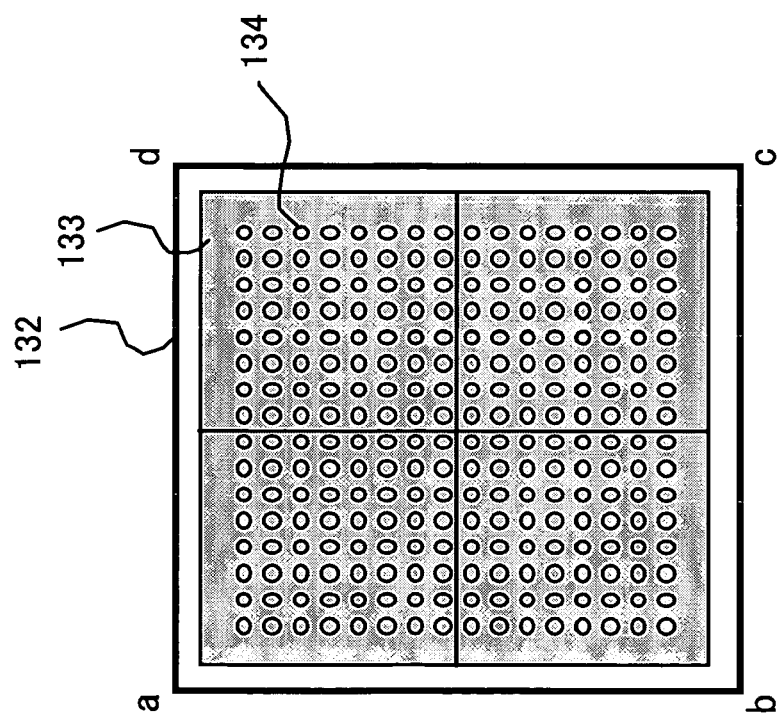

The modified illumination generating means 130 is arranged slightly apart from a position of the convergent position, and illuminated by the incident light having a divergent angle. FIGS. 5A and 5B are plane views of the modified illumination generating means 130 that receives the illumination light differently. In FIGS. 5A and 5B, 133 denotes a DOE surface that has a fine step shape formed on a substrate, such as quartz. 134 and 135 denote one light spot and indicate the light from one lens element in the multi-beam generating means 128. In other words, the light incident upon the modified illumination generating means 130 is a set of many light spots 134 and 135.

The sizes of the light spots 134 and 135 fluctuate in accordance with a distance between the DOE unit 132 and the condensing point 129. For example, that respective spots may overlap each other on the DOE surface 133 by increasing the distance or by enlarges the size of the light spot 135, as shown in FIG. 5B. The proper setting of the distance between the modified illumination generating means 130 and the condensing point 129 can protect the component from damages due to the energy concentration on the DOE surface 133. The state shown in FIG. 5B is preferable to the state shown in FIG. 5A. The reason why a shape of an area on which many spots 135 gather is rectangular is to reflect a rectangular shape of the illumination area 127.

The size and shape of the illumination area of the incident light upon the modified illumination generating means 130 are variable by driving the turret 123 through the driving mechanism 124 and switching the exit angle preserving optical element 120. Alternatively, an irradiating position on the modified illumination generating means 130 is changed by moving the modified illumination generating means 130 using the driving mechanism 139, and the illumination intensity distribution 164 may be turned to a desired shape.

Figure 6B:
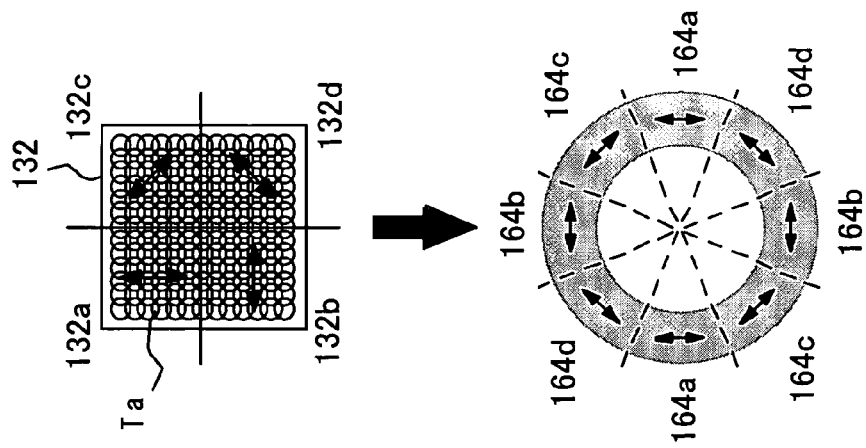
FIGS. 6A and 6B are schematic sectional and plane views for explaining a change of a size of an illumination area in the modified illumination generating means by changing a divergent angle of the exit angle preserving optical element shown in FIG. 1.
Figure 6A:
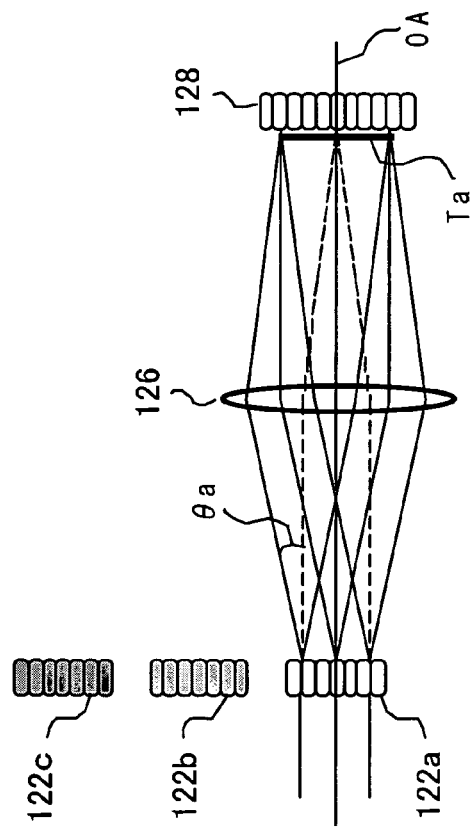

FIGS. 6A and 6B a generation of a tangential polarization direction using the element 122a having a large exit angle of θa. In FIG. 6A, the light exited at the exit angle θa is Fourier-transformed by the relay optical system 126, and forms a uniformly irradiated area TA on the incident surface of the multi-beam generating means 128. The irradiated area Ta is dimensioned so that the approximately entire surface of the DOE unit 132 is illuminated as shown in FIG. 6B via the multi-beam generating means 128. This is implemented by controlling the exit angle θa and a focal length of the relay optical system 126. The reproduced image 165 generated at a position of the aperture stop 162 by the DOE unit 132 is an annular distribution as shown in FIG. 6B, and the polarization direction is a tangential direction, as described with reference to FIG. 2.

FIGS. 7A to 7C show that the element 122b having a small exit angle of θb generates a dipole distribution that includes only tangentially polarized lights. In FIG. 7A, the exit angle θb is about half θa, and a uniformly irradiated area Tb formed on the incident surface of the multi-beam generating means 128 is about one-fourth as large as the irradiated area Ta. Thereby, it is possible to selectively irradiate only one of the CGHs 132a to 132d, and the modified illumination generating means 130 can move in the horizontal and perpendicular directions using the driving mechanism 139.

FIGS. 7B and 7C show that the modified illumination generating means 130 moves using the driving mechanism 139 so that the irradiated area TB falls within the areas 132a and 132b, and the intersection point of the cross lines is a position of the optical axis OA shown in FIG. 7A. Although it is not shown, the dipole distribution in the ±45° directions can be obtained by similarly setting the irradiated area Tb to fall within the areas 132c and 132d of the DOE unit 132.

FIGS. 8A to 8C show that the element 122c in which the horizontal exit angle θcx and the perpendicular exit angle θcy generates a quadrupole distribution that has a tangential polarization direction. FIG. 8A simultaneously shows the horizontal and perpendicular exit angles, and illustrates only the light from the center of the element 122c for simplicity. In FIG. 8A, the exit angle θcx is equal to the exit angle θb, and the exit angle θcy is equal to the exit angle θa. Therefore, in a uniformly irradiated area Tc formed on the incident surface of the multi-beam generating means 128, a length Tcx of the horizontal side in the x direction is equal to the length of the irradiated area Tb, and a length Tcy of the perpendicular side in the y direction is equal to the length of the irradiated area Ta.

It is clear that the irradiated area Tc shown in FIGS. 8B and 8C is a double rectangle of the irradiated area Tb. When the modified illumination generating means 130 is moved by using the driving mechanism 139 so that the irradiated area Tc falls within the CGHs 132a and 132b, a quadrupole distribution having the tangential polarization components shown in FIG. 8B is obtained. Similarly, when the modified illumination generating means 130 is moved by using the driving mechanism 139 so that the irradiated area Tc falls within the CGHs 132c and 132d, a quadrupole distribution shown in FIG. 8C is obtained.

As illustrated above, the turret 123 switches the exit angle preserving element 120 in order to switch the illumination intensity distribution to a desired one, and the driver 150 controls the driving mechanisms 124 and 139 in order to move the modified illumination generating means 130. This configuration provides various types of modified illuminations having tangentially polarized lights, and improves the image contrast of the circuit pattern and provides higher resolution exposure.

The desired illumination intensity distribution obtained as the reproduced image 164 of the modified illumination generating means 130 has a shape equal or similar to the illumination intensity distribution (or effective light source distribution) on a surface that substantially has a Fourier-transformation relationship with the reticle surface. While the effective light source distribution includes a distribution suitable for a pattern to be exposed, such as an annular distribution, a quadrupole distribution and a dipole distribution, the shape of the pattern is not limited.

The illumination condition can be easily varied as a switching means, such as a turret, switches the modified illumination generating means 130 that forms plural types of effective light source distributions. The exposure apparatus of this embodiment may arrange the phase plate unit 131 outside the optical path when it does not provide a polarization control. In case of a normal illumination instead of a modified illumination, a DOE that forms a circular illumination intensity distribution having a predetermined diameter is inserted into the optical path instead of the modified illumination generating means 130.

The relay optical system 160 forms the effective light source distribution or reproduced image 164 having an approximately uniform intensity on the aperture 162, using the diffracted light that has experienced a calculated amplitude modulation or phase modulation at the modified illumination generating means 130. The DOE unit 132 and the aperture 162 are arranged so that they have a Fourier transformation relationship. Due to this relationship, the divergent light from one arbitrary point of the DOE unit 132 contributes to the entire effective illumination intensity distribution 164. In other words, in FIGS. 5A and 5B, the arbitrary light that forms the light spots 134 and 135 forms on the aperture 152 the effective light source distribution 154 suitable for the modified illumination irrespective of the spot irradiation position.

As the spotted light from the condensing point 129 diverges at a spread angle that depends upon the multi-beam generating means 128, the illumination intensity distribution 164 generated by the DOE unit 132 slightly blurs according to the spread angle. However, the blur amount is defined by the spread angle, and the DOE unit 132 is designed so that the desired illumination intensity distribution expects the blur amount.

The zooming optical system 166 zooms the reproduced image 164 by a desired magnification, and projects the reproduced image 164 as a uniform light source image 168 on the incident surface of the multi-beam generating means 170.

When the desired uniform light source image 168 is projected on the incident surface of the multi-beam generating means 170, the effective light source distribution is transferred onto the exit surface as it is. The multi-beam generating means 170 is an optical integrator, such as a fiber bundle and a fly-eye lens that has plural micro-lenses, and the exit surface forms a light source plane with plural point light sources. Each fine lens may be made of a DOE, or a micro-lens array formed by etching process on the substrate.

The aperture stop 172 is arranged at the exit side of the multi-beam generating means 170, and has a shape corresponding to a desired shape, such as an annular shape. Only the secondary light source distribution can pass the opening in the aperture stop 172, and the linearly polarized components distribute in tangential directions. Simultaneously, the aperture stop 172 shields the unnecessary light.

The irradiation means 174 superimposes the exit lights from the micro-lenses in the multi-beam generating means 170, on the target surface (or the reticle 200 surface in this embodiment) so as to illuminate the target surface with an entirely uniform illumination intensity distribution. The irradiation means 174 includes a condenser lens, etc. The polarized illumination in the tangential direction is to illuminate the target surface using the illumination light having linearly polarized lights in a direction orthogonal to the incident surface that illuminates the target surface.

While this embodiment illuminates the target surface with entirely uniform illumination intensity distribution, the present invention is not limited to this embodiment. For example, the exit angles of the exit light from each fine area on the exit surface of the multi-beam generating means 170 is made to have different angles in two orthogonal directions so as to illuminate the target surface 200 using a slit illuminating shape, and the plate 400 may be exposed by scanning this slit-shaped exposure area.

The reticle 200 is made for example, of quartz, and has a circuit pattern (or an image) to be transferred. It is supported and driven by a reticle stage (not shown. The diffracted light from the reticle is projected onto the plate 400 via the projection optical system 300. The reticle 200 and the plate 400 are located in an optically conjugate relationship. Since the exposure apparatus 1 of this embodiment is a scanner, the reticle 200 and the plate 400 are scanned at a speed ratio of the reduction ratio. Thus, the pattern of the reticle 200 is transferred to the plate 172. If the exposure apparatus 1 is a stepper, the reticle 200 and the plate 400 remain stationary in exposing the reticle pattern.

The projection optical system 300 may use a (dioptric) optical system solely including a plurality of lens elements, a catadioptric optical system including a plurality of lens elements and at least one mirror, an optical system including a plurality of lens elements and at least one diffraction optical element such as a kinoform, and a catoptric optical system of a full mirror type, and so on. Any necessary correction of the chromatic aberrations may use a plurality of lens units made from glass materials having different dispersion values (Abbe values) or can arrange a diffraction optical element such that it disperses in a direction opposite to that of the lens unit. The projection optical system 300 is applicable to a so-called immersion exposure that fills the fluid in a space between the plate 400 and the projection optical system 300's final lens at the image side so as to make the NA greater than 1 for exposure at higher resolution.

The plate 400 is an exemplary object to be exposed, such as, a wafer and a LCD. A photoresist is applied to the plate 400. The stage (not shown) supports the plate 400 via a chuck (not shown). The reticle 200 and plate 400 are, for example, scanned synchronously. The positions of the stage (not shown) and reticle stage (not shown) are monitored, for example, by the interferometer, so that both are driven at a constant speed ratio.

Figure 9:
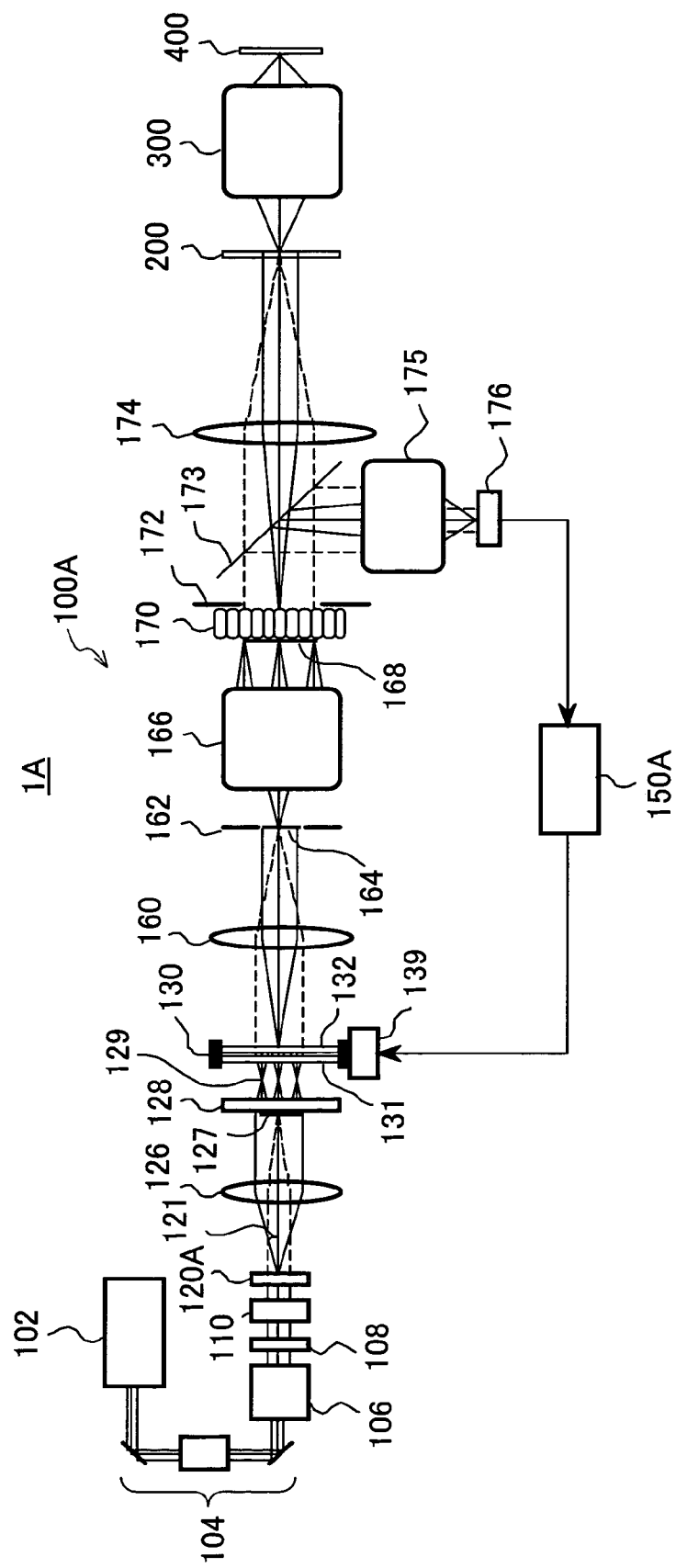
FIG. 9 is a schematic block diagram of an exposure apparatus according to a second embodiment of the present invention.

Referring now to FIGS. 9 to 17, a description will now be given of an exposure apparatus 1A that includes an illumination apparatus 100A according to a second embodiment of the present invention. Here, FIG. 9 is a schematic block diagram of the exposure apparatus 1A. Those elements in FIG. 9 which are the same as those shown in FIG. 1 are designated by the same reference numerals, and a description thereof will be omitted. While the exposure apparatus 1 switches the divergent angle exited from the exit angle preserving optical element 120 and changes the size and shape of the irradiated area of the DOE unit 132, the exposure apparatus 1A fixes the exited divergent angle and adjusts a position of the irradiated areas by the multiple light spots.

The exposure apparatus includes a half-mirror 173, a condenser optical system 175, and a light intensity monitor or detector 176. The exit light from the multi-beam generating means 170 is partially reflected on the half-mirror 173, and condensed on a two-dimensional sensor surface in the light intensity monitor 176 via the condenser optical system 175. Since the condenser optical system 175 images using an object side that is the exit surface of the multi-beam generating means 170 and an image side that is the two-dimensional sensor surface in the light intensity monitor 176, the illumination intensity distribution on the sensor surface is similar to the above illumination intensity distribution or effective light source distribution 168.

The illumination intensity distribution data measured on the sensor surface is sent to a driver 150A. The driver 150A controls the driving mechanism 139 based on this signal so as to minutely move the modified illumination generating means 130. The modified illumination generating means 130 adjusts the relative positions between the multiple light spots and the irradiated areas, and corrects the non-uniformity in the illumination intensity distribution.

A description will now be given of a method for turning the illumination intensity distribution 164 to a desired shape by moving the modified illumination generating means 130 in the optical path and changing the irradiated position. In FIG. 9, the light exited at the exit angle 121 is Fourier-transformed by the relay optical system 126, and forms a uniform irradiated area 127 on the incident surface of the multi-beam generating means 128. As shown in FIG. 10, the irradiated area 127 is set to an irradiated area Ua having the same size as that of each of four areas in the DOE unit 132, via the multi-beam generating means 128. This is realized by properly setting the exit angle 121 and the focal length of the relay optical system 126.

As shown in FIG. 10, the driving mechanism 139 drives the modified illumination generating means 130 in horizontal and perpendicular directions so that a center of the irradiated area Ua accords with a center of the DOE unit 132. Thereby, the irradiated area Ua is equally segmented and incident upon the areas 132a to 132d in the DOE unit 132. As a result of synthesis of dipole distribution images from the areas 132a to 132d, the reproduced image 164 at this time forms an annular distribution shown in FIG. 10, and its polarization components are aligned with a tangential direction.

FIGS. 11 and 12 show that the driving mechanism 139 drives the modified illumination generating means 130 in the horizontal and perpendicular directions so that the irradiated area US falls within the area 132a or area 132b in the DOE unit 132. In this way, the dipole distribution that has tangentially polarized lights is obtained. Although it is not shown, the dipole distribution in the ±45° can be obtained so that the irradiated area Ua falls within the area 132c or 132d in the DOE unit 132.

FIGS. 13 and 14 show that the driving mechanism 139 drives the modified illumination generating means 130 so that the irradiated area Ua extends over the areas 132a and 132b and the areas 132c and 132d. In this way, the dipole distribution that has tangentially polarized lights is obtained. Of course, only the phase plate unit 131 may be exchanged while the DOE unit 132 remains in the optical path.

In exposing a contact hole, the illumination of the quadrupole distribution sometimes needs to have linearly polarized lights in the radial direction instead of the tangential direction as shown in FIG. 15. In this case, the λ/4 phase plates 131a and 131b are replaced with each other so that the incident, circularly polarized light has a horizontal polarization direction in the area 131a and a perpendicular polarization direction in the area 131b. The tangential quadrupole distribution shown in FIG. 13 is easily turned to the radial quadrupole distribution shown in FIG. 15 by using another driving mechanism 139 and changing the modified illumination generating means 130.

An exposed circuit pattern has a difference between its horizontal line's critical dimension ("CD") and its perpendicular line's CD, and this difference is referred as a HV difference. The HV difference occurs when the illumination and projection optical systems have some errors and the σ uniformity destroys. That the "σ uniformity destroys" means, for example, the annular distribution shown in FIG. 10 becomes an ellipse apart from a perfect circle.

Figures 16, 17:
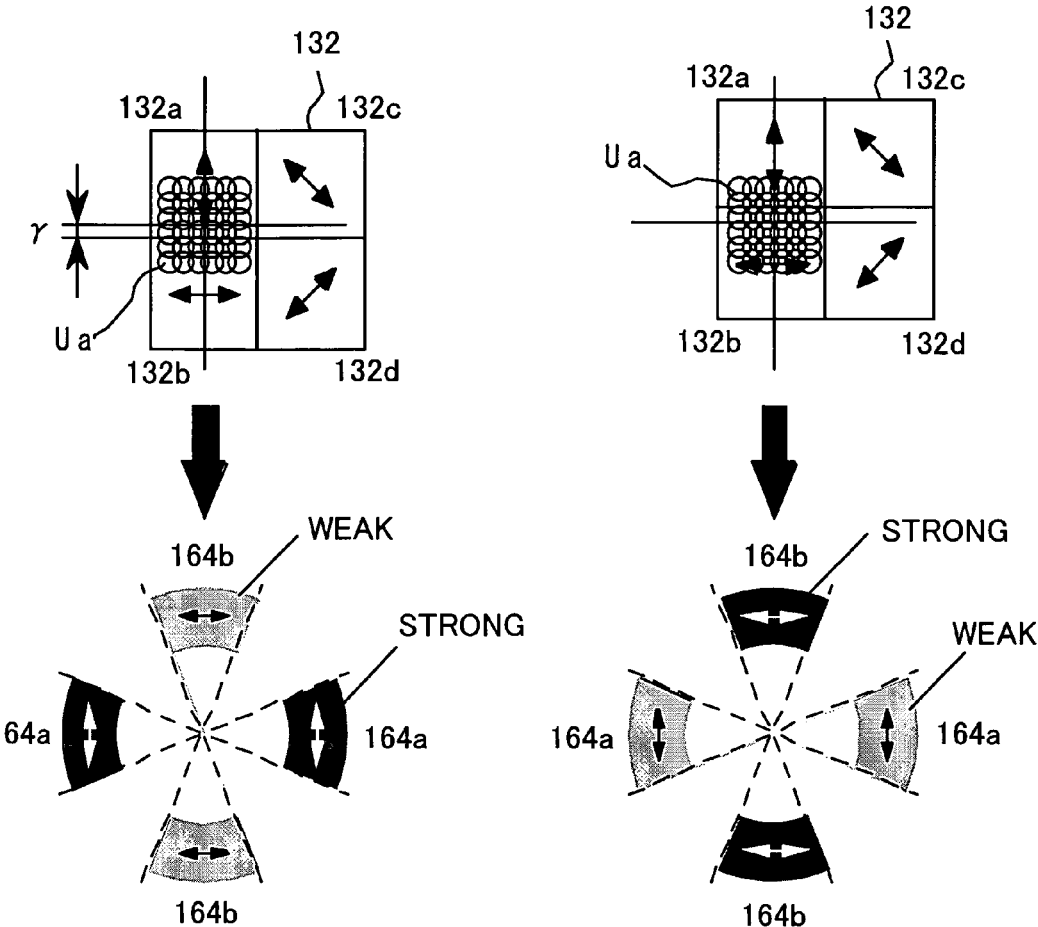
FIG. 16 is a schematic plane view for explaining one method of forming different illumination intensity distributions in a quadrupole in the quadrupole illumination shown in FIG. 13.
FIG. 17 is a schematic plane view for explaining another method of forming different illumination intensity distributions in a quadrupole in the quadrupole illumination shown in FIG. 13.

Referring now to FIGS. 16 and 17, a description will be given of a method of intentionally providing the illumination intensity distribution with the non-uniformity so as to correct the HV difference.

FIG. 16 shows that a center of the irradiated area Ua is offset from a center of the areas of 132a and 142b by γ in forming the above tangential quadrupole distribution shown in FIG. 13. Since a ratio of the incident light upon the area 132a is larger than that upon the area 132b, the dipole distribution in the horizontal direction formed by the area 132a is relatively stronger in intensity. This intensity is monitored by the above light intensity monitor 176, and fed back to the driver 150A. Thereby, the driving mechanism 139 minutely drives the modified illumination generating means 130 by the suitable γ that provides the intensity difference necessary to correct the HV difference. This adjustment changes the moment due to the intensity difference while maintains the shape of the illumination intensity distribution, and the effective σ has a slightly larger horizontal component. As a result, the contrast of the horizontal line increases relative to the perpendicular line, correcting the HV difference.

Similarly, as shown in FIG. 17, an offset of the irradiated area Ua enhances the dipole distribution in the perpendicular direction relatively, increases the contrast of the horizontal line, and corrects the HV difference.

The exposure apparatus of this embodiment also retreats the phase plate unit 131 from the optical path when it does not provide the polarization control. In case of the normal illumination is used instead of the modified illumination, the DOE that forms the circular illumination intensity distribution having a predetermined diameter is inserted into the optical path instead of the modified illumination generating means 130. Of course, the HV difference is corrected even when the polarized illumination is not used.

A description will now be given of an operation of the exposure apparatuses 1 and 1A. The linearly polarized light emitted from the light source 102 is deflected by the deflection optical system 104 toward the beam shaping optical system 106. The light that enters the beam shaping optical system 106 is shaped into a predetermined shape, and the polarization control means 108 removes the unnecessary linearly polarized lights. Next, the phase control means 110 converts the linearly polarized light into the circularly polarized light, and the exit angle preserving optical element 120 divides the light into plural point light sources. Next, the light from the exit angle preserving optical element 120 is incident as the circularly polarized light upon the multi-beam generating means 128 via the relay optical system 124.

The circularly polarized light exited from the multi-beam generating means 128 is incident as the circularly polarized light upon the modified illumination generating means 130 while maintaining the exit NA, and is converted into the desired modified illumination. As the modified illumination generating means 130 uses the entire incident light and converts the polarization direction without removing unnecessary polarization components, the light use efficiency is very high. The many spotted lights incident upon the entire surface of the modified illumination generating means 130, which is the circularly polarized lights, are turned into the linearly polarized lights having different polarization directions for respective areas segmented by the λ/4 phase plate unit 131. The resultant light is diffracted after experiencing the calculated amplitude modulation or phase modulation by the DOE unit 132, and becomes the amplitude-modulated or phase-modulated diffracted light by the modified illumination generating means 130. The diffracted light forms the reproduced image (or effective light source distribution) 164 on the aperture 162 via the relay optical system 160. The reproduced image 164 forms a desired illumination intensity distribution having an approximately uniform light intensity, and polarization components in desired directions. Next, the effective light source distribution 164 is zoomed by the zooming optical system 166, and incident upon the multi-beam generating means 170.

The light exited from each fine lens element in the multi-beam generating means 170 is superimposed on the reticle 200 as the target surface by the irradiating means 177 and, for example, Koehler-illuminates the target surface for the entirely uniform illumination intensity distribution. The reticle 200 is placed on the reticle stage, and driven during exposure in the scanner. The light that passes the reticle 200 and reflects the reticle pattern is imaged onto the plate 400 fixed on the stage via the wafer chuck (not shown) by the projection optical system 300 at a projection magnification (such as ¼ and ⅕). The wafer chuck is provided on the wafer stage, and the plate 400 is driven during the exposure. The aberration of the projection optical system 300 has been corrected, and the high-quality exposure process (at a desired resolution) is obtained on the plate 400.

Even when the light from the light source 102 fluctuates minutely due to the disturbance, the light from the exit angle preserving optical element 120 maintains the exit angle 122 as shown in FIG. 2, and the incident light position does not change upon the multi-beam generating means 128. In other words, the position of the illumination intensity distribution is fixed. In addition, the light from the multi-beam generating means 128 fixes the exit angle, and the incident light upon the modified illumination generating means 130 does not fluctuate substantially. Therefore, the influence on the illumination intensity distribution on the illuminated surface of the reticle 200 becomes negligibly small. As a result, the illumination apparatus 100 and 100A are very stable systems against the fluctuations of the light from the light source.

Thus, the illumination apparatuses 100 and 100A do not affect the illuminated area even when the light from the light source fluctuates, and the CGH forms the illumination intensity distribution for an arbitrary modified illumination. In addition, the illumination apparatuses 100 and 100A can provide the linearly polarized light in a desired direction, such as a tangential direction and a radial direction, without lowering the illumination efficiency for the arbitrary modified illumination condition.

Figure 18:
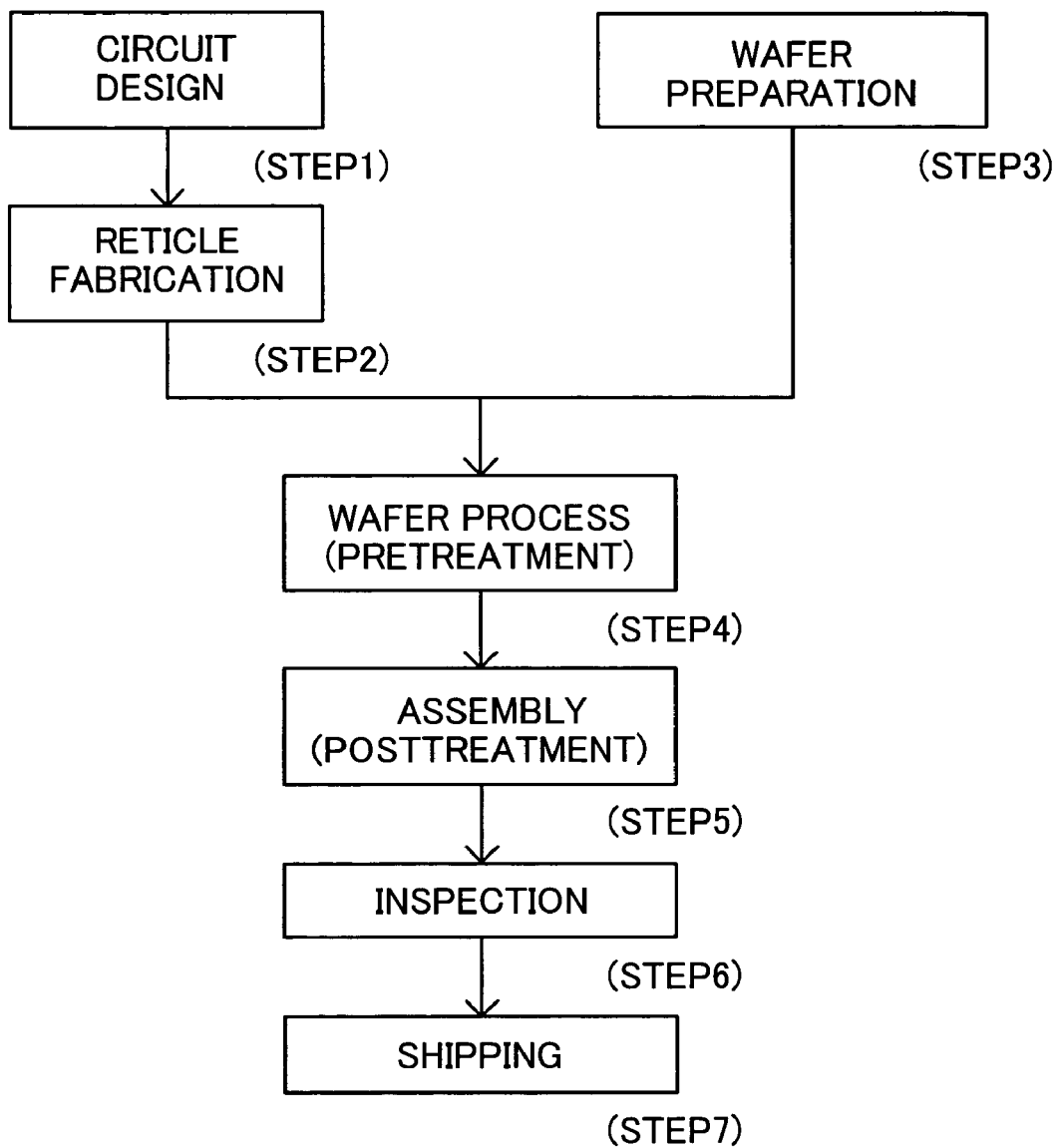
FIG. 18 is a flowchart for explaining a method for manufacturing devices (e.g., semiconductor chips such as ICs and LSIs, LCDs, and CCDs).
Figure 19:
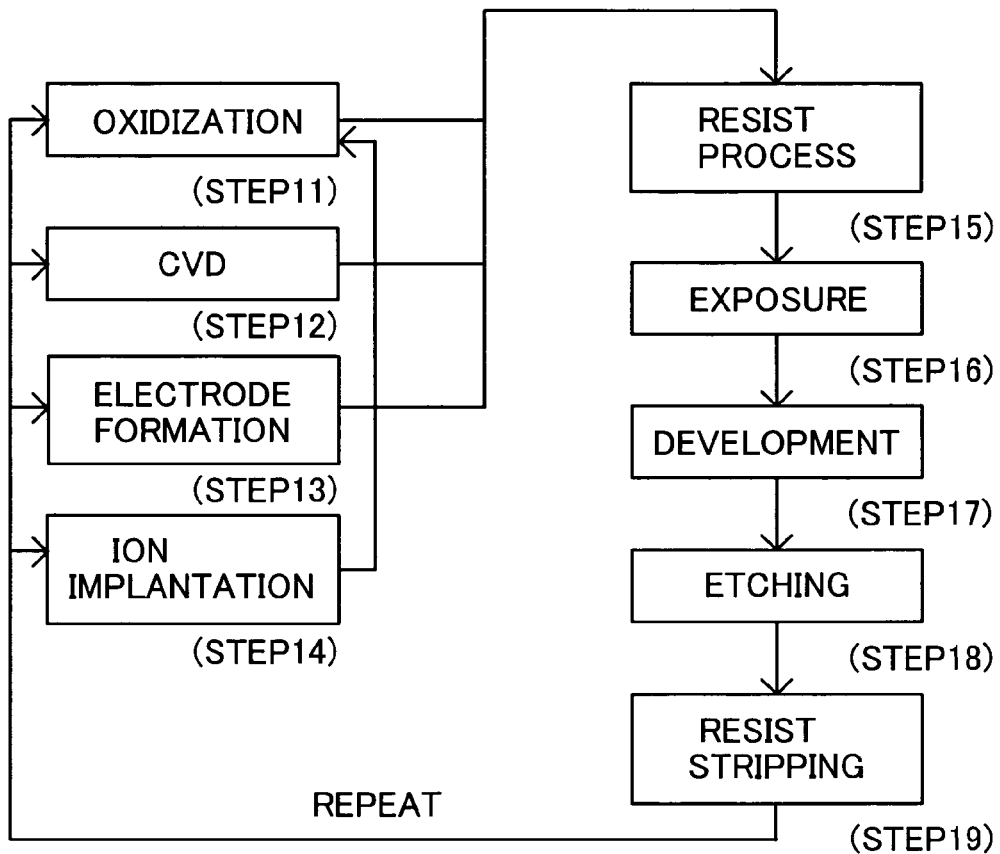
FIG. 19 is a detailed flowchart of a wafer step in step 4 in FIG. 18.

Referring now to FIGS. 18 and 19, a description will now be given of an embodiment of a device manufacturing method using the exposure apparatuses 1 and 1A. FIG. 18 is a flowchart for explaining a manufacture of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 19 is a detailed flowchart of the wafer process in step 4 in FIG. 18. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatuses 1 and 1A to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This embodiment can manufacture high-resolution devices with good productivity and economical efficiency (such as semiconductor devices, LCD devices, image pickup devices (e.g., CCDs), and thin film magnetic heads), whereas the prior art has difficulties in manufacturing them. Thus, the device manufacturing method that uses the exposure apparatuses 1 and 1A, and its resultant (intermediate and final) products also constitute one aspect of the present invention.

This application claims a foreign priority benefit based on Japanese Patent Applications No. 2004-183019, filed on Jun. 21, 2004, which is hereby incorporated by reference herein in its entirety as if fully set forth herein.

What is claimed is:

1. An illumination optical system for illuminating a target surface using light from a light source, said illumination optical system comprising:
   a waveplate unit that includes first and second waveplates, the first and second waveplates converting incident light into linearly polarized light in polarization directions that are different from each other;
   a diffractive optical element unit that includes first and second diffractive optical elements that form illumination intensity distributions that are different from each other on a surface that substantially has a Fourier transformation relationship with the target surface; and
   an optical unit concurrently illuminating a first diffractive optical element and a second diffractive optical element of the diffractive optical element unit,
   wherein the first diffractive optical element receives linearly polarized light converted by the first waveplate, and the second diffractive optical element receives linearly polarized light converted by the second waveplate.

2. An illumination optical system according to claim 1, wherein the waveplate unit further includes third and fourth waveplates, and the diffractive optical element unit includes third and fourth diffractive optical elements, the third and fourth waveplates converting incident light into linearly polarized light in polarization directions that are different from each other, the third and fourth diffractive optical elements forming illumination intensity distributions that are different from each other on a surface that substantially has a Fourier transformation relationship with the target surface,
   wherein the third diffractive optical element receives linearly polarized light converted by the third waveplate and the fourth diffractive optical element receives linearly polarized light converted by the fourth waveplate, and
   wherein the polarization direction of the linearly polarized light from each of the third and fourth waveplates is different from that formed by each of the first and second waveplates, and the illumination intensity distributions formed by each of the third and fourth diffractive optical elements is different from that formed by each of the first and second diffractive optical elements.

3. An illumination optical system according to claim 1, further comprising:
   an illumination area changing unit for changing an illuminated area on the first and second diffractive optical element of said diffractive optical element unit illuminated by said optical unit.

4. An illumination optical system according to claim 3, wherein said optical unit includes plural optical integrators for illuminating the diffractive optical element unit, plural optical integrators having different exit angles, said illumination area changing unit including a switching unit for switching the plural optical integrators on an optical path, and
   wherein switching of the plural optical integrators by the switching unit makes different an illumination intensity distribution on the surface that substantially has a Fourier transformation relationship with the target surface.

5. An illumination optical system according to claim 3, wherein said illumination area changing unit includes a driving unit for driving said waveplate unit and said diffractive optical element unit in a direction perpendicular to an optical axis, and
   wherein driving of the waveplate unit and the diffractive optical element unit by the driving unit makes different an illumination intensity distribution on the surface that substantially has the Fourier transformation relationship with the target surface.

6. An illumination optical system according to claim 3, further comprising a light intensity detector for detecting an illumination intensity distribution on the surface that substantially has the Fourier transformation relationship with the target surface, wherein the illumination area changing unit changes the illumination area in accordance with a detection result by said light intensity detector.

7. An exposure apparatus comprising:
   an illumination optical system according to claim 1 for illuminating a reticle that has a pattern; and
   a projection optical system for projecting onto an object, the pattern of the reticle illuminated by said illumination optical system.

8. A device manufacturing method comprising the steps of:
   exposing an object using an exposure apparatus according to claim 7; and
   developing the object that has been exposed.

* * * * *